US008922249B1

(12) United States Patent
Abuelma'atti et al.

(10) Patent No.: US 8,922,249 B1

(45) Date of Patent: Dec. 30, 2014

(54) PROGRAMMABLE CMOS-BASED NONLINEAR FUNCTION SYNTHESIZER

(71) Applicant: King Fahd University of Petroleum and Minerals, Dhahran (SA)

(72) Inventors: Muhammad Taher Abuelma'atti, Dhahran (SA); Saad Radhi Alabbas, Alqateef (SA)

(73) Assignee: King Fahd University of Petroleum and Minerals, Dhahran (SA)

( * ) Notice: Subject to any disclaimer, the term of this patent is extended or adjusted under 35 U.S.C. 154(b) by 0 days.

(21) Appl. No.: 14/489,407

(22) Filed: Sep. 17, 2014

(51) Int. Cl.
*H03B 21/00* (2006.01)
*G06G 7/28* (2006.01)

(52) U.S. Cl.
CPC .......................................... *G06G 7/28* (2013.01)
USPC .............................. 327/105; 708/8; 708/853

(58) Field of Classification Search
USPC ............... 327/105, 106, 107; 708/8, 845, 853
See application file for complete search history.

(56) References Cited

U.S. PATENT DOCUMENTS

| | | | |
|---|---|---|---|
| 7,952,395 B2 | 5/2011 | Abuelma'atti et al. |
| 8,598,915 B1 | 12/2013 | Abuelma'atti et al. |
| 8,601,417 B2 | 12/2013 | Gowda et al. |
| 8,650,235 B2 | 2/2014 | Torosyan |

OTHER PUBLICATIONS

Popa, Cosmin Radu, "Hyperbolic Functions' Synthesizers," *Current-Mode Analog Nonlinear Function Synthesizer Structures*, pp. 95-127, 2013.

Srivastava et al., "Fully Programmable Gaussian Function Generator Using Floating Gate MOS Transistor," *International Scholarly Research Network (ISRN) Electronics*, vol. 2012.

*Primary Examiner* — William Hernandez

(74) *Attorney, Agent, or Firm* — Richard C. Litman

(57) ABSTRACT

The programmable CMOS-based nonlinear function synthesizer is a circuit that assumes that the required nonlinear function can be approximated by the summation of hyperbolic tangent (tan h) functions with different arguments. Each term of the tan h function expansion is realized using a current-controlled current-conveyor (CCCCII), or an operational transconductance amplifier (OTA)) with a different bias current. The output weighted currents of these CCCCIIs or OTAs are algebraically added to produce the output current. The present circuit can be easily integrated, extended to include higher order terms of the tan h-function expansion and programmed to generate arbitrary hard nonlinear functions. By controlling the bias current and without changing the aspect ratios of the transistors, various tan h functions with different arguments from the same topology can be obtained.

10 Claims, 8 Drawing Sheets

300

400

800

PROGRAMMABLE CMOS-BASED NONLINEAR FUNCTION SYNTHESIZER

BACKGROUND OF THE INVENTION

1. Field of the Invention

The present invention relates generally to synthesizers, and particularly to a programmable CMOS-based nonlinear function synthesizer that allows for the nonlinear function to be approximated by summation of hyperbolic tangent (tan h) functions via different arguments.

2. Description of the Related Art

Despite its limited accuracy, it is very well known that analog nonlinear signal processing is much faster than its digital counterpart. This justifies the use of analog nonlinear signal processing in applications where speed, not the accuracy, is the major concern. Such applications cover a wide range including, but not limited to, medical equipment, instrumentation, analog neural networks and telecommunications. Therefore, over the years, several approaches have been reported for synthesizing analog nonlinear functions. These approaches suffer from at least the following disadvantages. Firstly, only one or two functions can be realized, and secondly, the designer must use piecewise linear approximations to approximate the required nonlinear function.

Thus, a programmable CMOS-based nonlinear function synthesizer solving the aforementioned problems is desired.

SUMMARY OF THE INVENTION

The programmable CMOS-based nonlinear function synthesizer is a circuit that assumes that the required nonlinear function can be approximated by the summation of hyperbolic tangent (tan h) functions with different arguments. Each term of the tan h function expansion is realized using a current-controlled current-conveyor (CCCCII), or an operational transconductance amplifier (OTA)) with a different bias current. The output weighted currents of these CCCCIIs or OTAs are algebraically added to produce the output current.

The present circuit can be easily integrated, extended to include higher order terms of the tan h-function expansion and programmed to generate arbitrary hard nonlinear functions. By controlling the bias current and without changing the aspect ratios of the transistors, various tan h functions with different arguments from the same topology can be obtained.

These and other features of the present invention will become readily apparent upon further review of the following specification and drawings.

BRIEF DESCRIPTION OF THE DRAWINGS

Similar reference characters denote corresponding features consistently throughout the attached drawings.

DETAILED DESCRIPTION OF THE PREFERRED EMBODIMENTS

The programmable CMOS-based nonlinear function synthesizer 200 (shown in FIG. 2) is a circuit that approximates a required nonlinear function by the summation of hyperbolic tangent (tan h) functions with different arguments. Each term of the tan h function expansion is realized using a current-controlled current-conveyor (CCCCII) 100 (or an operational transconductance amplifier (OTA)) with a different bias current. The output weighted currents of these CCCCIIs (OTAs) are algebraically added. The programmable CMOS-based nonlinear function synthesizer 200 can be easily integrated, extended to include higher order terms of the tan h-function expansion and programmed to generate arbitrary hard nonlinear functions. By controlling the bias current and without changing the aspect ratios of the transistors, various tan h functions with different arguments from the same topology can be obtained.

The key idea of the present programmable nonlinear function synthesizer 200 is the fact that many hard nonlinear functions can be approximated by the summation of tan h functions as shown in equation (1).

$$y(x) = \sum_{n=1}^{N} \gamma_n \tanh(\alpha_n x). \tag{1}$$

In equation (1), the current y(x) represents the required nonlinear function, x represents the normalized input voltage, $\alpha_n$ is a positive integer or non-integer constant and $\gamma_n$ is a positive or negative integer or non-integer weighting factor.

Usually the current-controlled current-conveyor (CCCCII) or the operational transconductance amplifier (OTA) is treated as a linear building block to design active filters, oscillators and amplifiers. However, the relationship between the input voltage $V_y$ of a CMOS current-conveyor and the current $I_x$ is a saturated nonlinear function. This nonlinearity is partially attributed to the nonlinear performance of the translinear loop and the current-mirrors used in designing the current conveyor. The present programmable CMOS-based nonlinear function synthesizer uses the inherent nonlinearity of the CCCCII 100 (shown individually in FIG. 1, and as a cascade in FIG. 2) to approximate the function tan h($\alpha_n$x) where $\alpha_n$ is an integer or non-integer number. A multiple of the tan h($\alpha_n$x) functions with different values of $\alpha_n$ are then weighted by arbitrary current-gain amplifiers (202*a*, 202*b*, 202*c*, and 202*d*) with gain=$\gamma_n$ to finally add them together and produce the output current y(x) of equation (1). The inherent nonlinearity of the OTA can be used for the same purpose.

Figure 1:
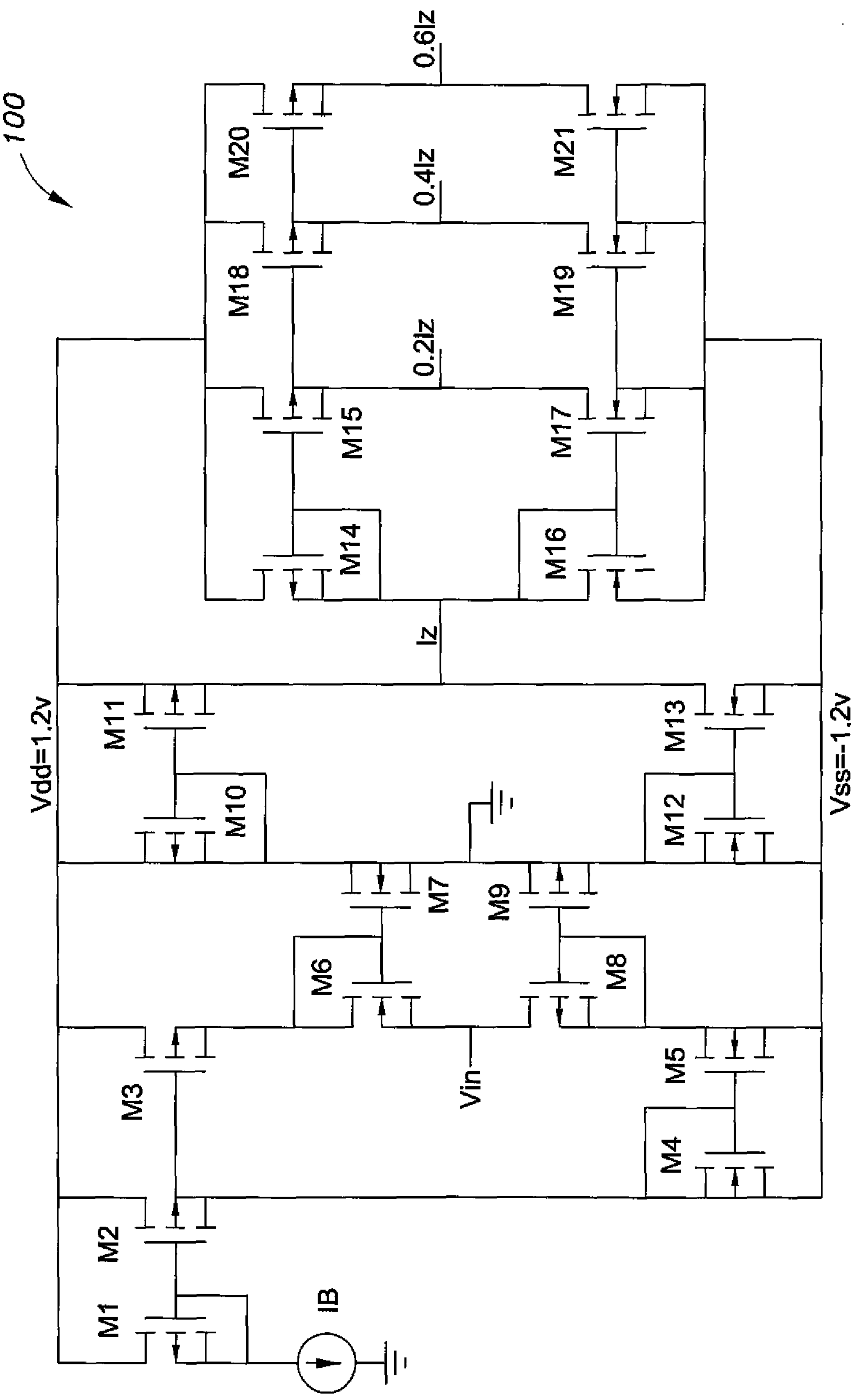
FIG. 1 is a schematic diagram of the class AB CCCCII used in the programmable CMOS based nonlinear function synthesizer, according to the present invention.

The present CCCCII is a simple class AB translinear circuit 100 formed of transistors M1-M13, as shown in FIG. 1. The current-voltage transfer characteristic of the class AB CCCCII shown in FIG. 1 is a saturated nonlinear function. The transfer function is represented by a hyperbolic tangent (tan h) function. By controlling the bias current of FIG. 1, and without changing the aspect ratios of the transistors, it is possible to obtain several tan h functions with different arguments. For example, tan h(x), tan h(2x) and tan h(3x) may be obtained from the same topology.

The output current of each CCCCII can be weighted using current amplifiers or current mirrors as shown by transistors M14-M21 of FIG. 1. The aspect ratios of transistors M14-M21 are selected based on the required value of $\gamma_n$. Equation (1) can be realized by adding the weighted output currents of a number of CCCCII with different biasing currents and weighting factors $\gamma_n$.

Figure 2:
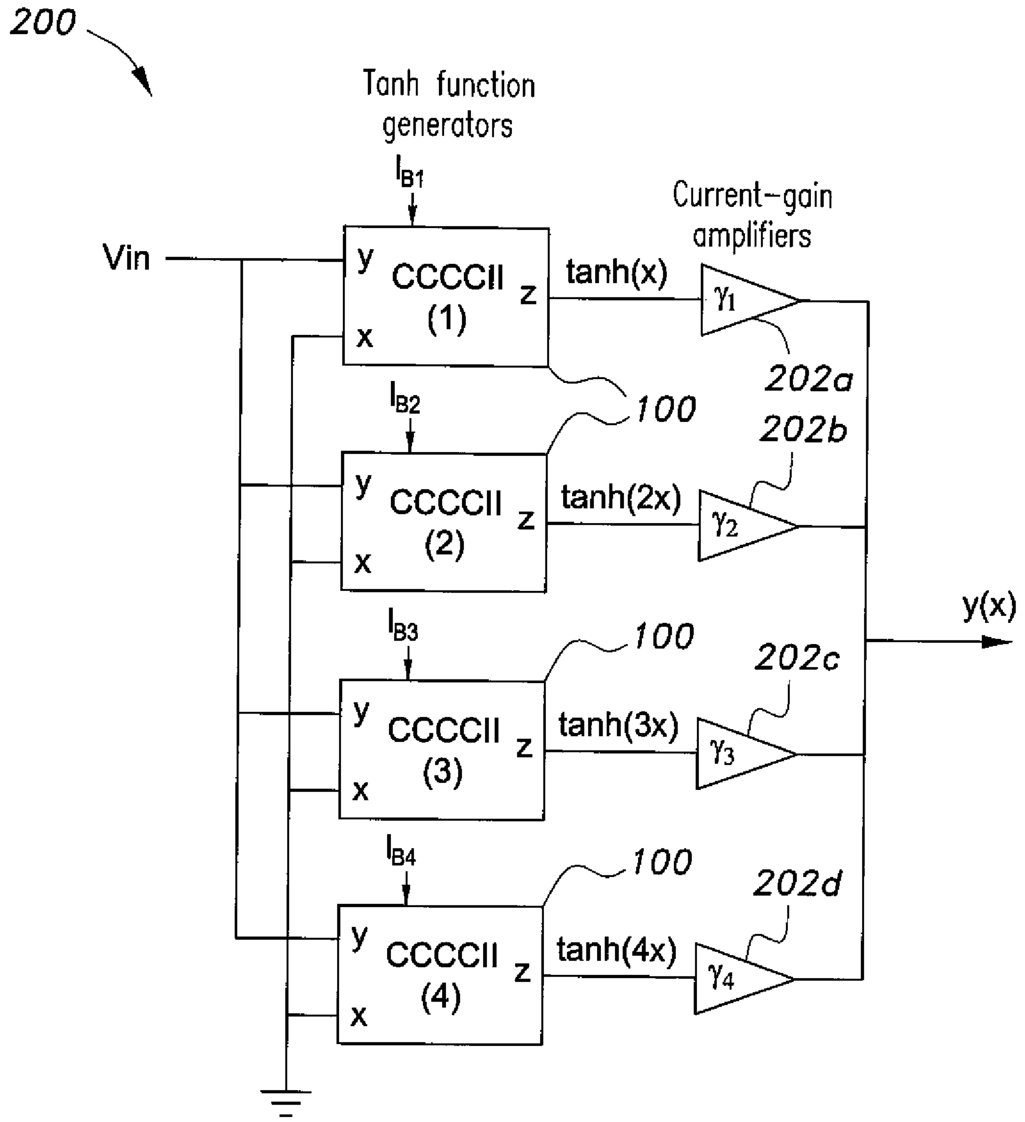
FIG. 2 is a block diagram of the programmable CMOS based nonlinear function synthesizer using the CCCCIIs of FIG. 1, according to the present invention.
Figure 3:
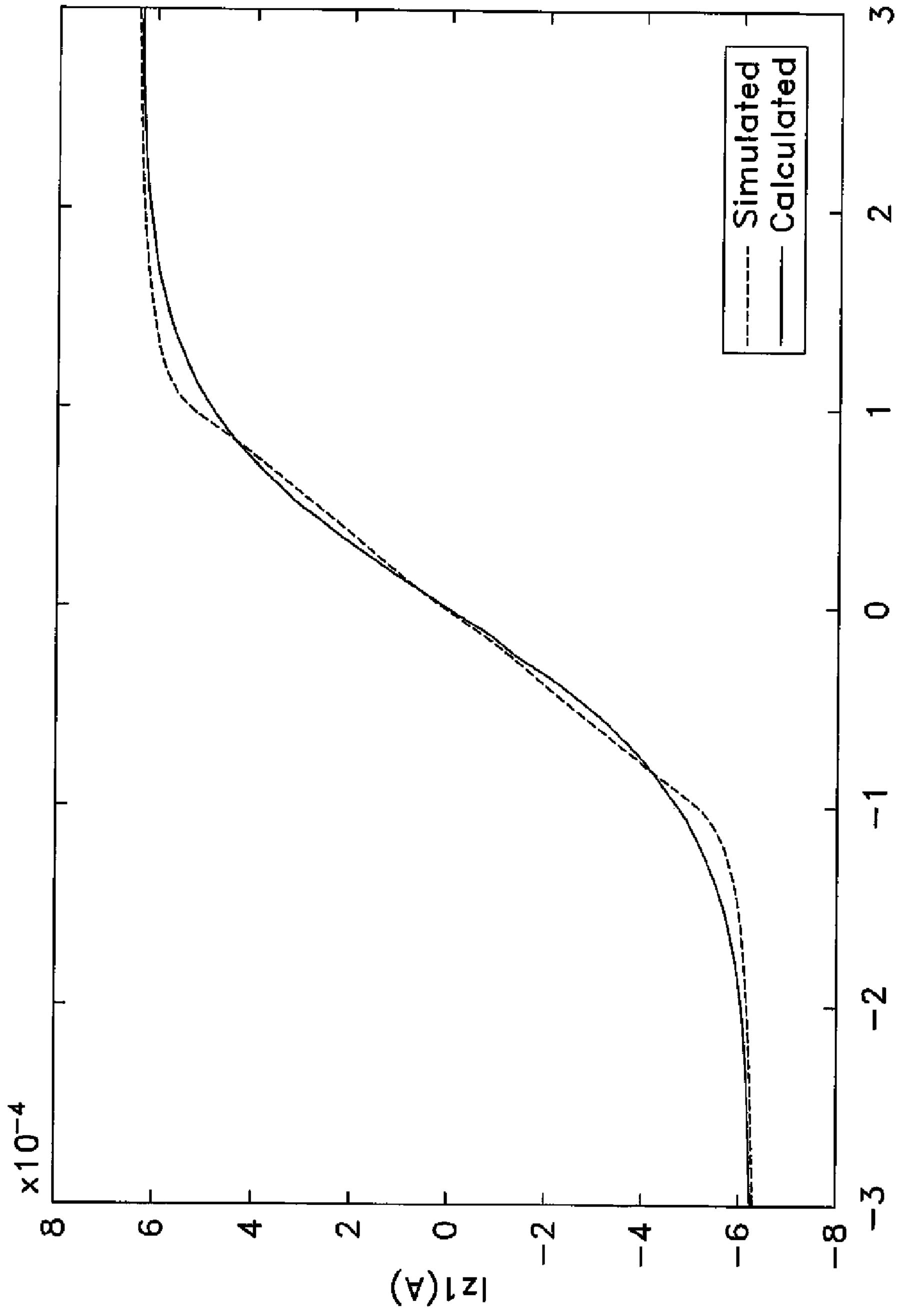
FIG. 3 is a plot showing simulated and calculated results of the tan h(x) function with RRMS error=9.35% according to the present invention.
Figure 4:
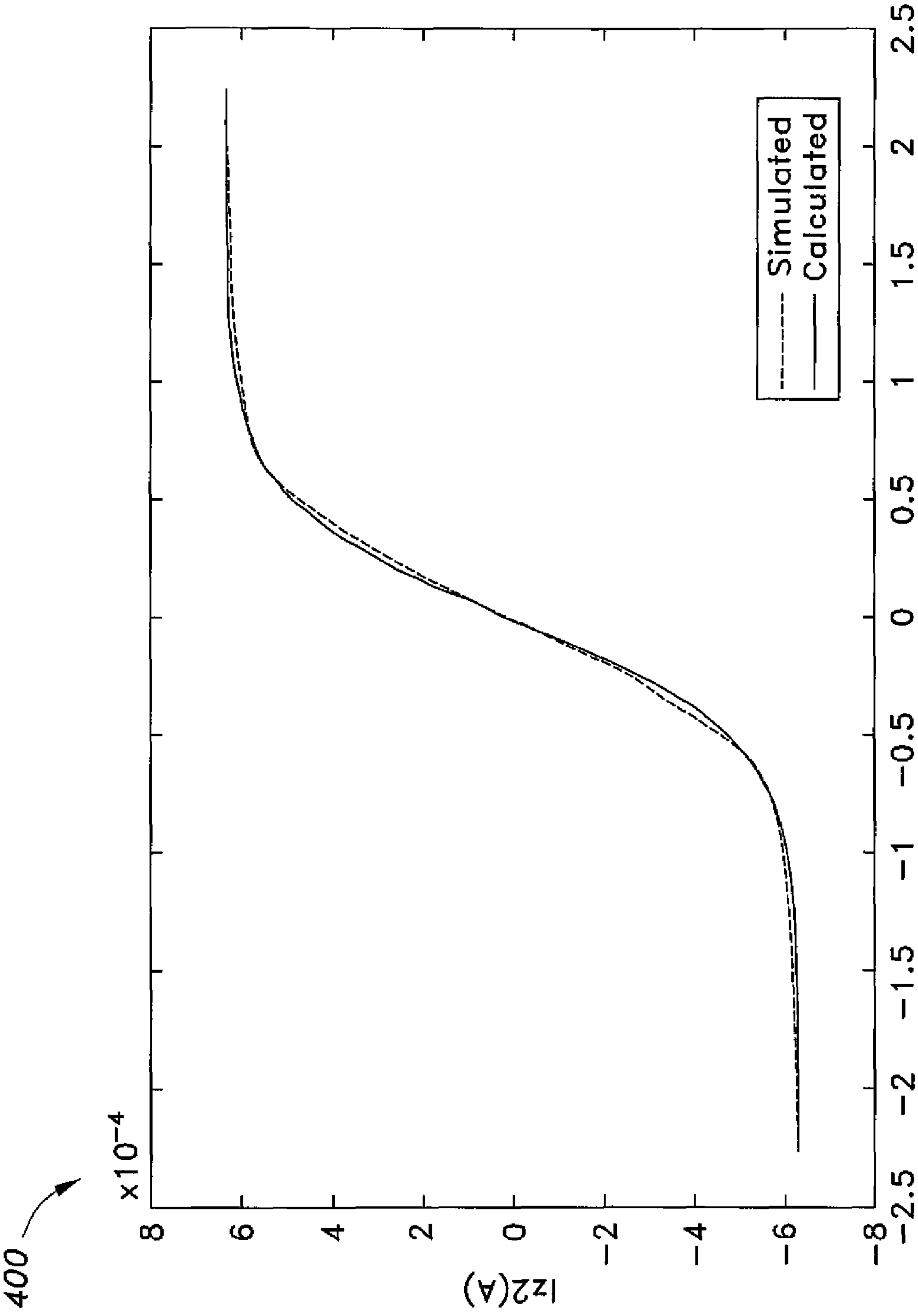
FIG. 4 is a plot showing simulated and calculated results of the tan h(2x) function with RRMS error=4.76% according to the present invention.
Figure 5:
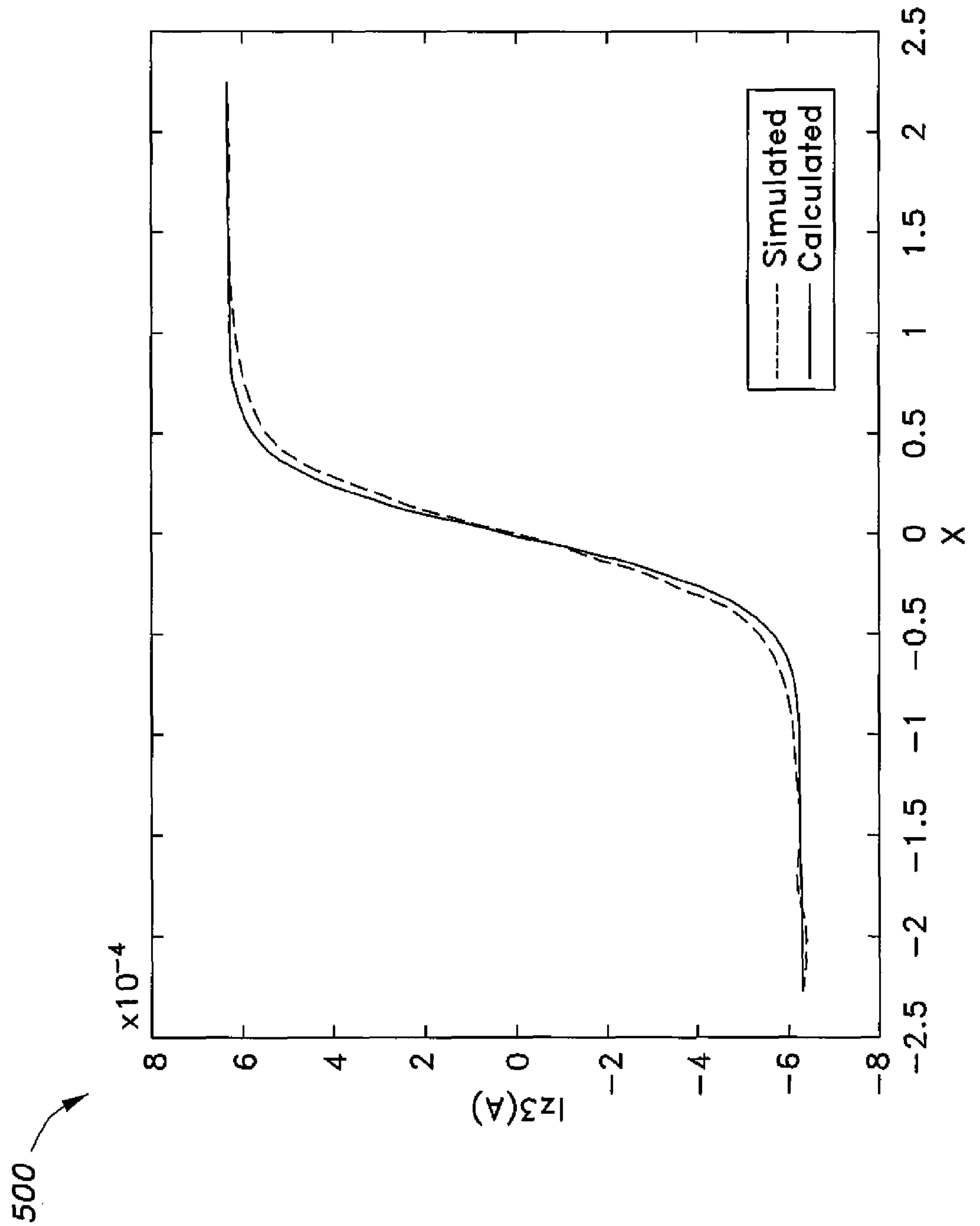
FIG. 5 is a plot showing simulated and calculated results of the tan h(3x) function with RRMS error=6.4% according to the present invention.
Figure 6:
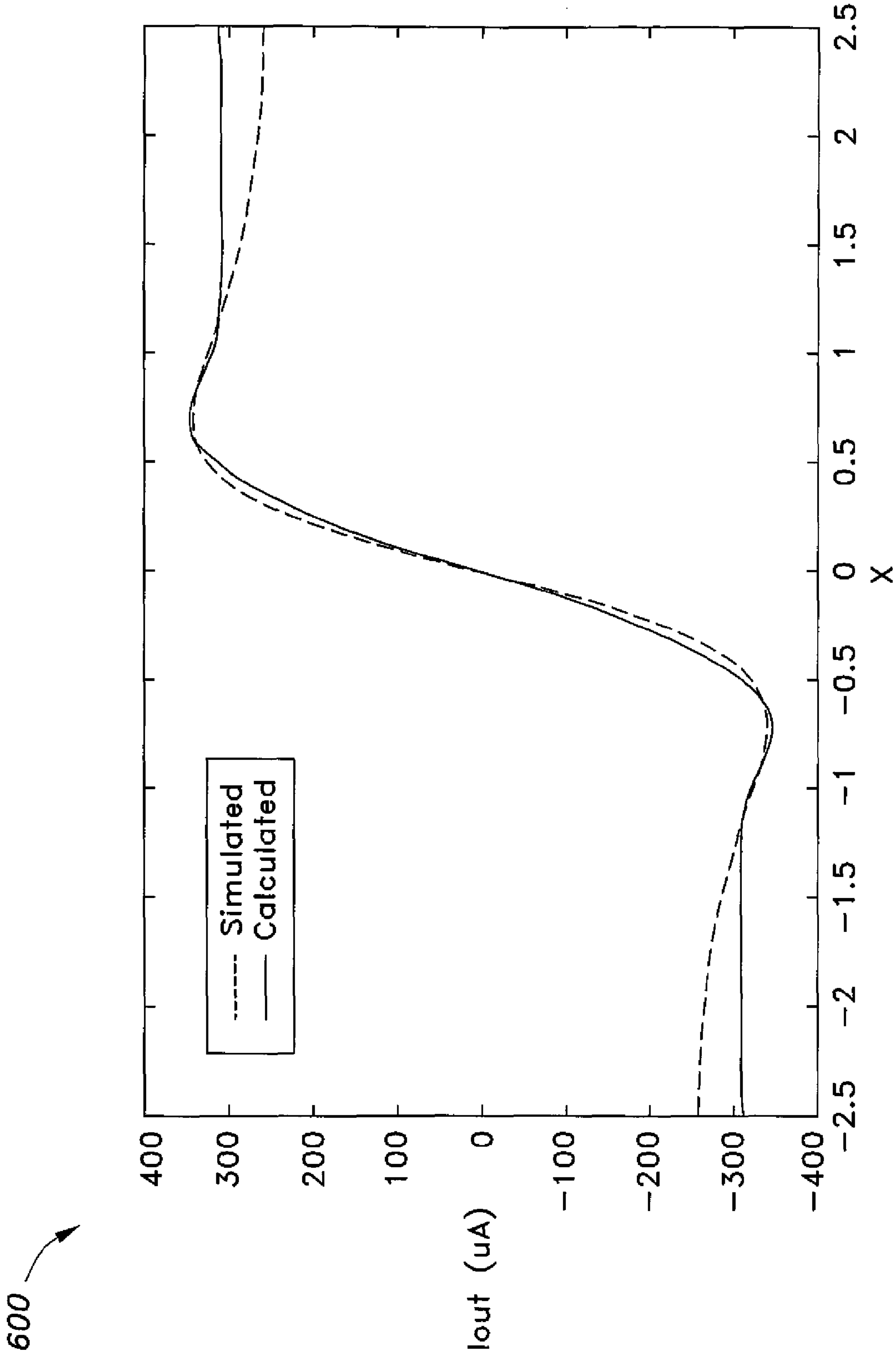
FIG. 6 is a plot showing simulated and calculated results for a multi-weighted nonlinear function according to the present invention.
Figure 7:
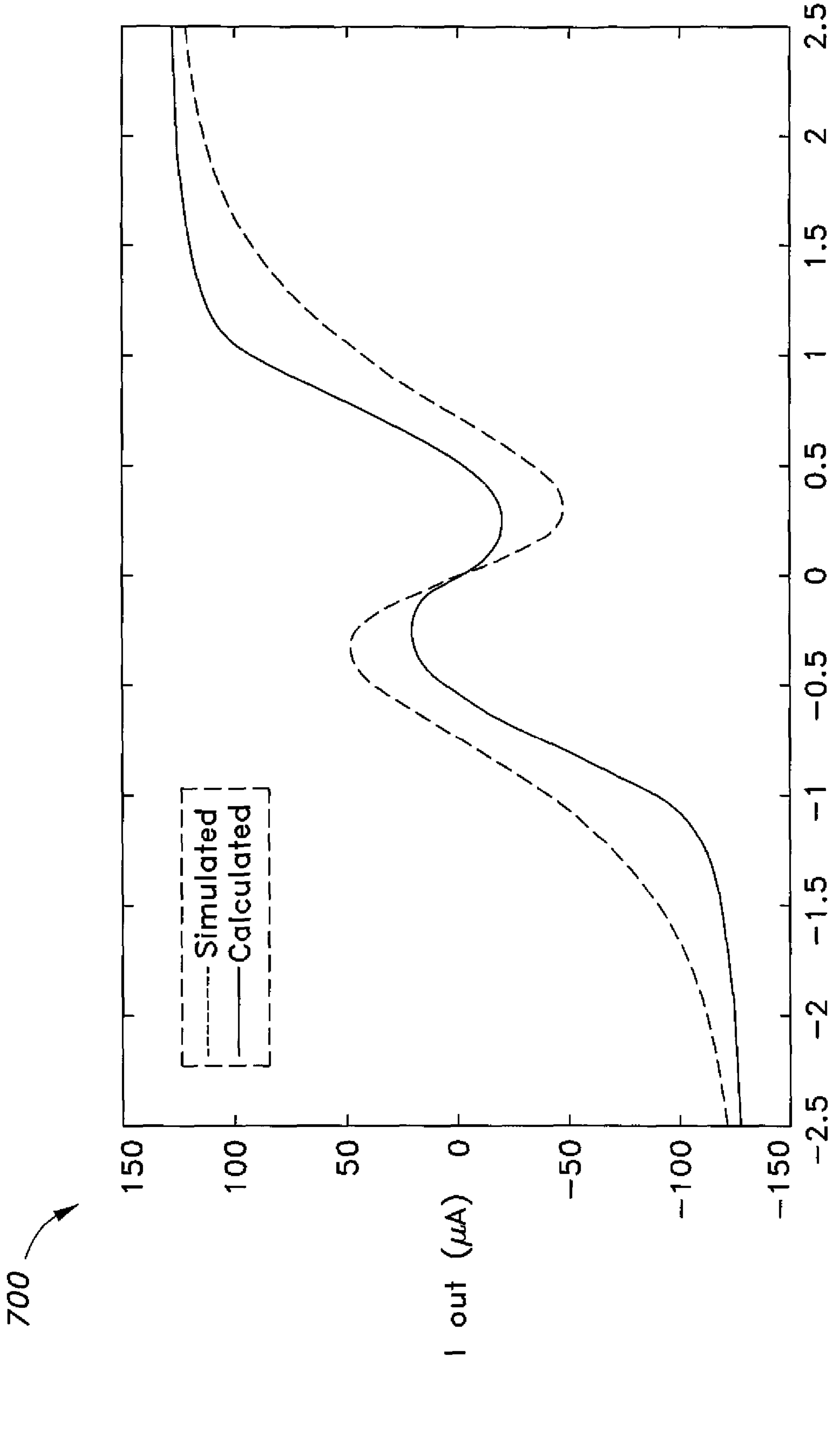
FIG. 7 is a plot showing simulated and calculated results for a second multi-weighted nonlinear function according to the present invention.
Figure 8:
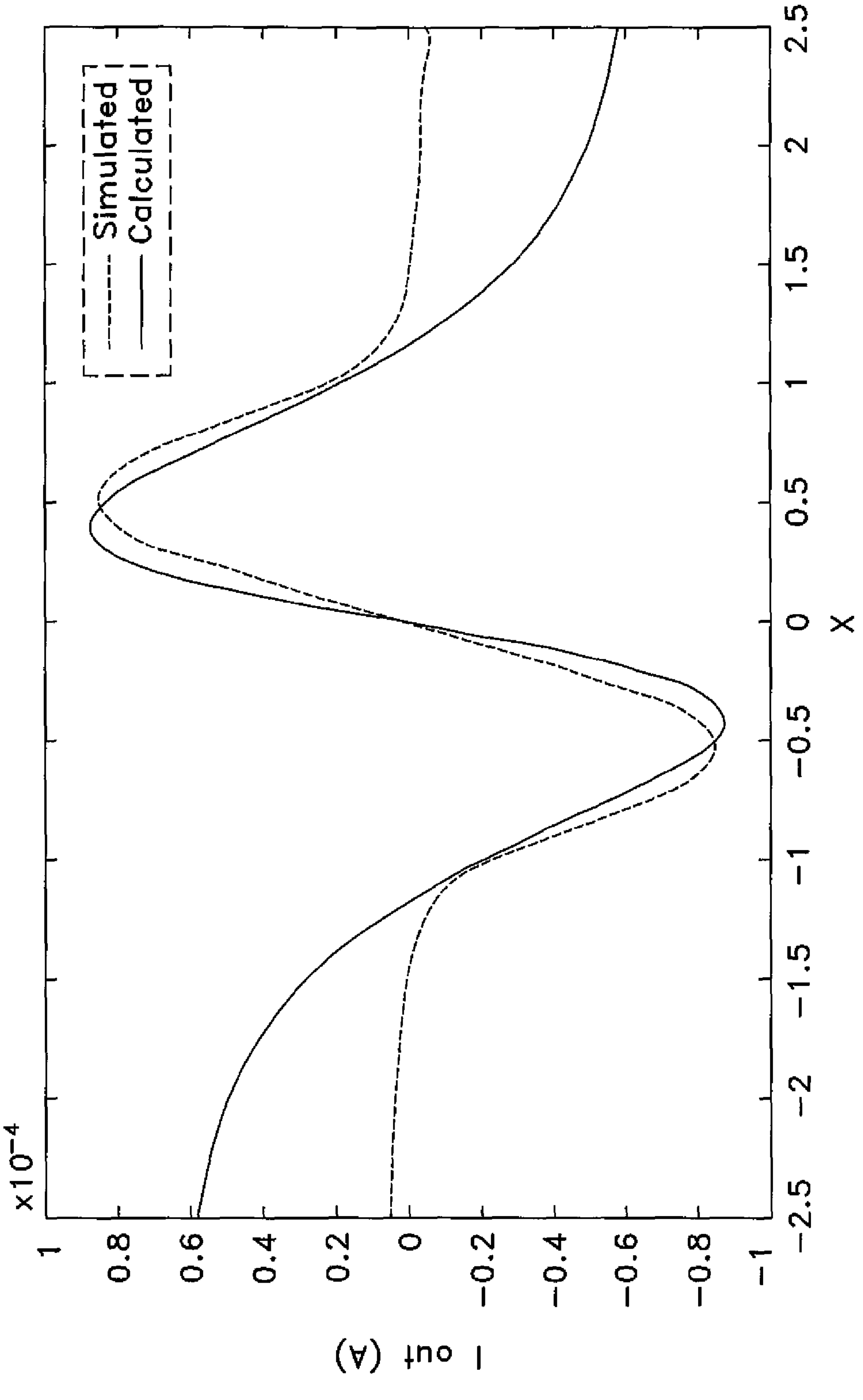
FIG. 8 is a plot showing simulated and calculated results for a third multi-weighted nonlinear function according to the present invention.

FIG. 2 shows a possible realization of equation (1) with n=4. A bias voltage $V_B=\sqrt{I_B/k}$, where $I_B$ is the biasing current of the CCCCII, x is a normalized input voltage=$V_{in}/V_B$, and k is the transconductance factor.

PSPICE simulation software and 0.35 μm process parameter technology was used to investigate the accuracy of approximating the transfer characteristic of a class AB CCCCII by a tan h function and the accuracy of the present analog function synthesizer. The DC supply voltages used are ±1.2V with biasing currents $I_{B1}$=60 μA, $I_{B2}$=250 μA and $I_{B3}$=500 μA for the functions tan h(x), tan h(2x) and tan h(3x) respectively. The current-gain amplifiers, formed of transistors M14-M21 of FIG. 1, can provide three arbitrary gains that can be obtained by adjusting the aspect ratios (W/L) of these transistors. The aspect ratios of the transistors M1-M13 of all the CCCCIIs were 50 μm/3 μm. The simulation results obtained are shown in FIGS. 3-8 together with the calculations obtained using MATLAB. The accuracy of the simulation results is measured using the Relative Root Mean Square (RRMS) error criterion expressed by equation (2).

$$RRMS=\sqrt{\frac{\sum_{m=1}^{M}\left(\frac{y_{simm}-y_{calcm}}{y_{calcm}}\right)}{M}}. \quad (2)$$

In equation (2) $y_{simm}$ is the value obtained from simulation at point m, $y_{calcm}$ is the value obtained from MATLAB calculations and M is the total number of points used in calculation. The results obtained are shown in plots 300, 400, and 500 of FIGS. 3-5 and RRMS errors obtained are 9.35%, 4.76% and 6.4% for the functions tan h(x), tan h(2x) and tan h(3x) respectively. Using these three tan h functions, the following three nonlinear functions were simulated.

$$I_{out}=632(-0.6\tan h(x)+0.8\tan h(2x)+0.2\tan h(3x))\ \mu A, \quad (3)$$

and $$I_{out}=632(0.6\tan h(x)-0.2\tan h(2x)-0.2\tan h(3x))\ \mu A, \quad (4)$$

and, $$I_{out}=632(-0.6\tan h(x)+0.3\tan h(2x)+0.2\tan h(3x))\ \mu A. \quad (5)$$

In equations (3)-(5) the factor 632 is just a scaling factor. The results obtained are shown in plots 600, 700, and 800 of FIGS. 6-8, together with the calculations obtained using MATLAB. For the functions of equations (3) and (4) the errors obtained were in the range x=±2.5 are 9.76% and 19.5 8% for the function of equation (3) and (4) respectively. For the function of equation (5) the error obtained was in the range x=±1.2 is 3.73%. The results were obtained without any attempt to optimize the circuit to minimize the errors. The proposed approach can be easily expanded to accommodate extremely hard nonlinearities if needed. The major advantage of the present topology is the current-controlled programmability which, contrary to other available realizations, allows many hard nonlinear functions to be synthesized from the same topology, just by controlling a number of bias currents of the CCCCII (or OTA) blocks and/or the gains of current amplifiers.

During implementation, care must be taken with aspect ratios of the transistors used and the possible errors due to transistor mismatches and the channel length modulation effects. Fortunately, because of the built-in programmability, these errors can be corrected by fine tuning of the bias currents of each CCCCII (or OTA) and/or the gains of the current amplifiers until the synthesized function closely fits the required nonlinear function.

It is to be understood that the present invention is not limited to the embodiments described above, but encompasses any and all embodiments within the scope of the following claims.

We claim:

1. A programmable CMOS-based nonlinear function synthesizer, comprising:

a CMOS circuit having a plurality of bias inputs, a plurality of current outputs and a corresponding plurality of signal inputs, an n-th one of the current outputs in relation to its corresponding signal input defining a saturated nonlinear transfer function characterized by the relation, $$\tan h(\alpha_n x),$$

where $\alpha_n$ is a positive integer/non-integer constant, and x represents a normalized voltage as the signal input;

weighing circuitry comprised of current mirrors operable with each output of the plurality of current outputs to form a weighted output for each said output;

summation circuitry connected to the weighted outputs, and providing an algebraic sum of the weighted outputs, the algebraic sum being characterized by the relation, $$y(x)=\sum_{n=1}^{N}\gamma_n\tanh(\alpha_n x),$$

where current y(x) represents the required nonlinear function, and $\gamma_n$ is a positive/negative integer/non-integer weighting factor for each value of n, where n is an integer between 1 and N, where N represents a total number of the current outputs; and programmable bias currents $I_{B_n}$ connected to the bias inputs, where $\alpha_n$ is a positive integer/non-integer constant that can be programmed by the bias inputs.

2. The programmable CMOS-based nonlinear function synthesizer according to claim 1, wherein the CMOS circuit comprises a plurality of current-controlled current-conveyors (CCCCIIs).

3. The programmable CMOS-based nonlinear function synthesizer according to claim 1, wherein the CMOS circuit comprises a plurality of operational transconductance amplifiers (OTAs).

4. The programmable CMOS-based nonlinear function synthesizer according to claim 1, further comprising unique values for each bias input of the plurality of bias inputs, wherein correspondingly unique hyperbolic tangent functions are obtained.

5. The programmable CMOS-based nonlinear function synthesizer according to claim 1, further comprising fixed transistor aspect ratios of the weighing circuitry based on the $\gamma_n$ weighing factors, the fixed transistor aspect ratios not affecting the programmability of the programmable CMOS-based nonlinear function synthesizer.

6. The programmable CMOS-based nonlinear function synthesizer according to claim 5, wherein the fixed transistor aspect ratios (W/L) are approximately 50 μm/3 μm.

7. A programmable CMOS-based nonlinear function synthesizer, comprising:

a plurality of second generation current controlled current conveyors (CCCCIIs) each CCCCII of the plurality having a first input terminal, a second input terminal, a bias terminal accepting a programmable bias current $I_{B_n}$ and an output terminal, the plurality arranged in a circuit in which all of the second input terminals are connected together to a common reference potential, and all of the first input terminals are connected together accepting a signal input, each CCCCII operating in a region defining a saturated nonlinear transfer function characterized by the relation, $$\tan h(\alpha_n x),$$

where $\alpha_n$ is a positive integer/non-integer constant, n corresponds to the nth CCCCII and x represents a normalized voltage as the signal input;

weighing circuitry comprised of current mirrors operable with each said CCCCII output to form a weighted output for each said programmable output;

for each CCCCII, a corresponding current gain amplifier connected to the output terminal thereof, outputs of the amplifiers being connected together to form summation circuitry which provides an algebraic sum of the CCCCII outputs, the algebraic sum being characterized by the relation, $$y(x) = \sum_{n=1}^{N} \gamma_n \tanh(\alpha_n x),$$

where current y(x) represents the required nonlinear function, $\alpha_n$ is a positive integer/non-integer constant that can be programmed via the bias terminal, and $\gamma_n$ is a positive/negative integer/non-integer weighting factor as determined by the weighing circuitry.

8. The programmable CMOS-based nonlinear function synthesizer according to claim 7, wherein the common reference potential is ground potential.

9. The programmable CMOS-based nonlinear function synthesizer according to claim 7, further comprising fixed transistor aspect ratios of the weighing circuitry based on the $\gamma_n$ weighing factors, the fixed transistor aspect ratios not affecting the programmability of the programmable CMOS-based nonlinear function synthesizer.

10. The programmable CMOS-based nonlinear function synthesizer according to claim 9, wherein the fixed transistor aspect ratios (W/L) are approximately 50 μm/3 μm.

* * * * *